United States Patent
Lee et al.

(10) Patent No.: US 7,049,248 B2
(45) Date of Patent: May 23, 2006

(54) METHOD FOR MANUFACTURING SEMICONDUCTOR DEVICE

(75) Inventors: Min Yong Lee, Seoul (KR); Dong Su Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/876,489

(22) Filed: Jun. 28, 2004

(65) Prior Publication Data

US 2005/0142893 A1   Jun. 30, 2005

(30) Foreign Application Priority Data

Dec. 26, 2003  (KR) .................. 10-2003-0097454

(51) Int. Cl.
*H01L 21/31* (2006.01)
*H01L 21/469* (2006.01)

(52) U.S. Cl. .............. 438/778; 438/768; 438/787
(58) Field of Classification Search ............. 438/768, 438/769, 778, 787, 906, 969, 974
See application file for complete search history.

(56) References Cited

U.S. PATENT DOCUMENTS

| 5,936,300 | A | * | 8/1999 | Sasada et al. ............. 257/632 |
| 6,010,936 | A | * | 1/2000 | Son ........................... 438/303 |
| 6,037,204 | A |   | 3/2000 | Chang et al. |
| 6,074,919 | A |   | 6/2000 | Gardner et al. |
| 6,083,795 | A |   | 7/2000 | Liang et al. |
| 6,180,543 | B1 |  | 1/2001 | Yu et al. |
| 6,232,164 | B1 |  | 5/2001 | Tsai et al. |
| 6,294,448 | B1 |  | 9/2001 | Chang et al. |
| 6,626,967 | B1 | * | 9/2003 | Takami et al. ............. 51/308 |
| 6,683,356 | B1 |  | 1/2004 | Tsuchiaki |
| 6,858,543 | B1 | * | 2/2005 | Lee et al. ................... 438/706 |

FOREIGN PATENT DOCUMENTS

| JP | 03-046224 | 2/1991 |
| JP | 03-276718 | 12/1991 |

\* cited by examiner

*Primary Examiner*—Phuc T. Dang
(74) *Attorney, Agent, or Firm*—Heller Ehrman LLP

(57) ABSTRACT

The present invention discloses a method for manufacturing semiconductor device wherein a cleaning process of a buffer layer is performed prior to a formation of a nitride film. The cleaning process allows to maintain the deposition thickness of the nitride film even when the time between the formation of the buffer layer and the formation of the nitride film is long.

4 Claims, 3 Drawing Sheets

METHOD FOR MANUFACTURING SEMICONDUCTOR DEVICE

BACKGROUND OF THE INVENTION

1. Field of the Invention

The present invention relates to method for manufacturing semiconductor device, and in particular to a improved method for manufacturing semiconductor device, wherein a cleaning process of a buffer layer is performed prior to a formation of a nitride film so that a decrease in a deposition thickness of the nitride film is prevented even when the time between the formation of the buffer layer and the formation of the nitride film is long to improve a reliability of the device.

2. Description of the Background Art

As the size of a semiconductor device is reduced, the thickness of the film deposited in the device is also reduced. When a nitride film for gate spacer is deposited directly on a semiconductor substrate, characteristic of the device is degraded due to a stress of the nitride film on the semiconductor substrate during subsequent thermal processes. In order to reduce the stress, a buffer layer between the semiconductor substrate and the nitride film has been proposed. However, when the period between the times of the deposition of the buffer layer and the nitride film is increased, the deposition thickness of the nitride film is drastically decreased.

In addition, when the length of a channel region is decreased due to the reduction in size of the device, the dose of ion-implant for adjusting threshold voltage must be increased to prevent decrease of cell threshold voltage due to a short channel effect. The increase in the dose to adjust threshold voltage not only results in increase in resistance and a coulomb fail but also increase in write time and an increase in leakage current due to reduction in high concentration source/drain junction region and depletion region. Moreover, a refresh time is also decreased.

SUMMARY OF THE INVENTION

Accordingly, it is an object of the present invention to provide method for manufacturing semiconductor device wherein a cleaning process of a buffer layer is performed prior to a formation of a nitride film so that a decrease in a deposition thickness of the nitride film is prevented even when the time between the formation of the buffer layer and the formation of the nitride film is long to improve a reliability of the device.

In order to achieve the above-described object of the invention, there is provided a method for manufacturing semiconductor device, the method comprising:

forming an active region defined by a device isolation film on a semiconductor substrate, subjecting the active region to an ion-implant process for adjusting therehold voltage, forming a gate electrode on the semiconductor substrate, forming a TEOS film on the semiconductor substrate by a LPCVD method, subjecting the surface of the TEOS film to a cleaning process using a solution selected from the group consisting of $H_2SO_4$ solution, SC-1 solution and combination thereof, and forming $Si_3N_4$ film serving as a gate spacer on the TEOS film by a CVD method.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing semiconductor device in accordance with a preferred embodiment of the present invention will now be described in detail with reference to the accompanying drawings.

FIGS. 1A through 1D are cross-sectional diagrams illustrating the method for manufacturing semiconductor device in accordance with the present invention.

Figure 1A:
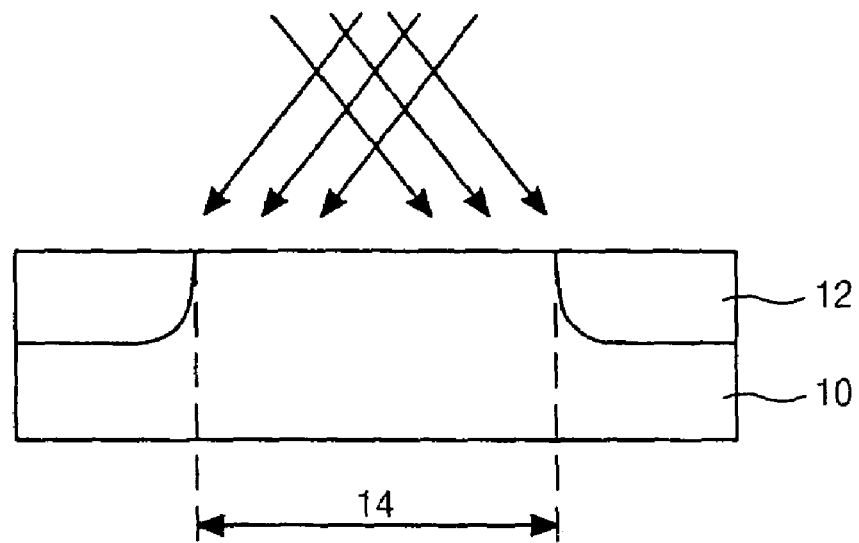
FIGS. 1A through 1D are cross-sectional diagrams illustrating the method for manufacturing semiconductor device in accordance with the present invention.

Referring to FIG. 1A, an active region 14 defined by a device isolation film 12 on a semiconductor substrate 10.

Thereafter, the active region 14 is subjected to an ion-implant process for adjusting threshold voltage. Preferably, the ion-implant process may be tilt ion-implant process performed at a tilt angle ranging from 0 to 60° and at a dose ranging from 1.55E13 to 1.65E13 ions/cm$^2$. The ion-implant process is preferably performed at an orientation ranging from 0 to 90° by rotating 0 to 4 times. The dose is 5 to 10% less than that of the conventional method. This is possible because the characteristic of the interface between a TEOS film and a $Si_3N_4$ film is improved due to the cleaning process, thereby preventing a reduction of threshold voltage although the dose is less than that of the conventional method.

Figure 1B:
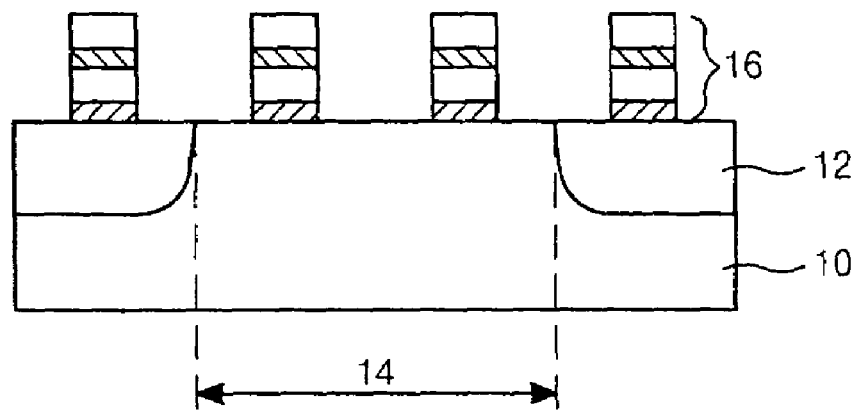

Now referring to FIG. 1B, a gate electrode 16 is formed on the semiconductor substrate 10.

Figure 1C:
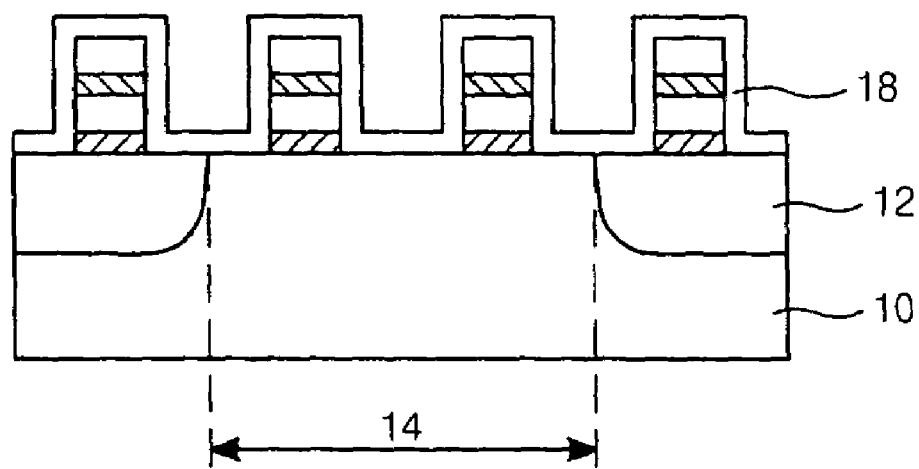

Referring to FIG. 1C, a TEOS film 18, which is a buffer layer, is formed on the semiconductor substrate 10 via a LPCVD method.

Thereafter, the semiconductor substrate 10 is subjected to a cleaning process. Preferably, the cleaning process is performed using a solution selected from a group consisting of a $H_2SO_4$ solution, a SC-1 solution or combinations thereof. The $H_2SO_4$ solution preferably has a volume ratio of $H_2SO_4$ to $H_2O$ ranging from 1:4 to 1:50. As it is well-known to the skilled in the art, SC-1 solution comprises $NH_4OH$, $H_2O_2$ and de-ionized water.

Figure 1D:
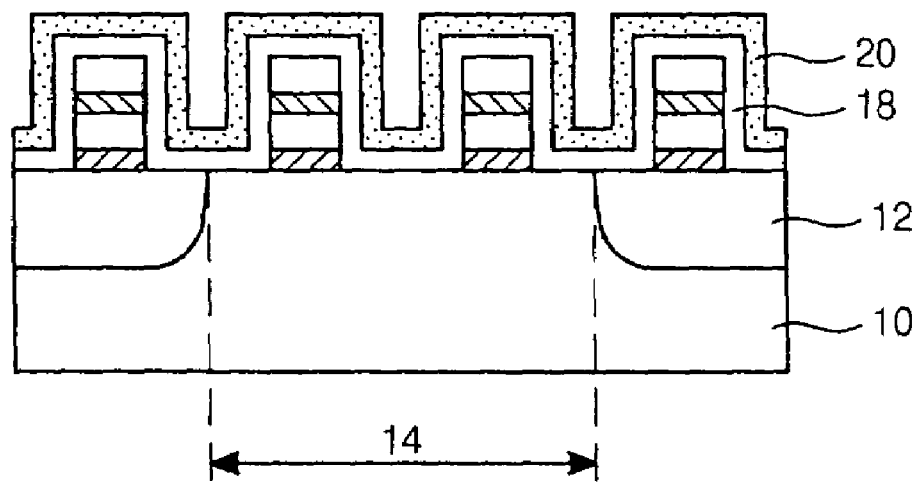

Referring to FIG. 1D, a $Si_3N_4$ film 20 for gate spacer is formed on the semiconductor substrate 10 via a CVD method. As described above, the cleaning process improves a deposition thickness of the $Si_3N_4$ film 20.

Figure 2:
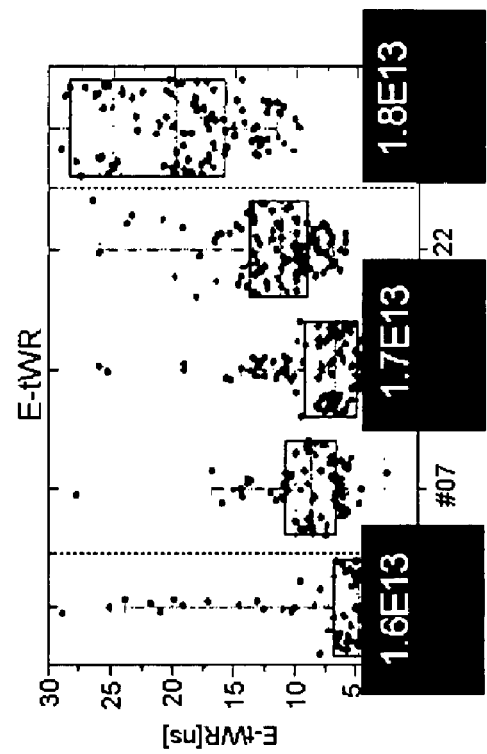
FIG. 2 is a graph illustrating an experiment data of refresh time and write time.
Figure 2:
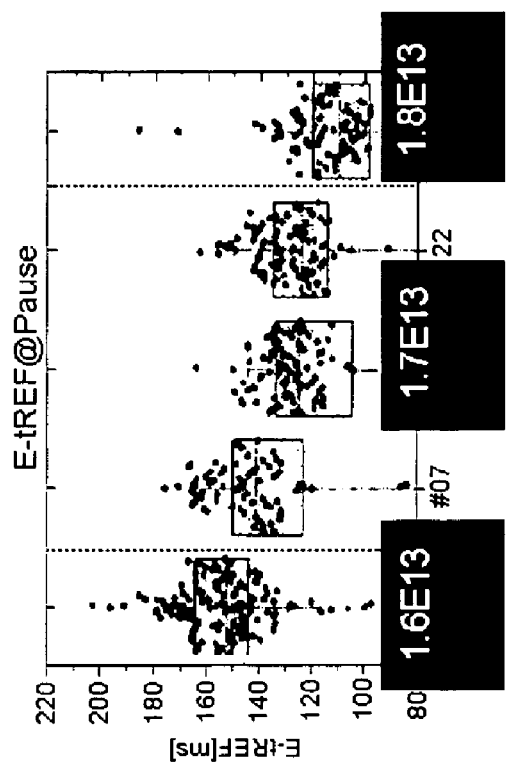

FIG. 2 is a graph illustrating an experiment data of a refresh time and a write time, wherein a variation of the refresh time and the write time according to a variation of the dose in ion-implant process for adjusting threshold voltage.

As shown in FIG. 2, the refresh time (at the left) is increased as the dose is decreased and the write time is decreased as the dose is decreased. That is, after the cleaning process is performed, the device characteristics are significantly improved by an ion-implantation process with a reduced dose compared with the dose of the conventional method.

The delay time, which is the period between the time of deposition of the TEOS film and the time of deposition of the nitride film, and the thickness of the deposited nitride film with and without the cleaning process are shown in Table 1.

TABLE 1

| TEOS film | | 100 Å | | |
|---|---|---|---|---|
| Delay Time | | 10 hrs. | | 5 days |
| Cleaning | | RN | | RN |
| Nitride film | | | 90 Å | |
| Thickness | AVG | 82.6 | 76.9 | 82.7 | 69.3 |
| of the | MAX | 84.1 | 79.0 | 84.0 | 75.1 |
| nitride | MIN | 81.5 | 75.2 | 81.7 | 67.1 |
| film | MAX − MIN | 2.6 | 3.8 | 2.3 | 8.0 |

Referring to Table 1, an actual thickness of the nitride film having a desired thickness of 90 Å is shown. The nitride film is deposited after 10 hours and 5 days, respectively, from the time of deposition of the TEOS film having a thickness of 100 Å with and without the cleaning process (R denotes a cleaning process performed using a $H_2SO_4$ solution and N denotes a cleaning process performed using a SC-1 solution).

The nitride film deposited after 10 hours from the time of deposition of the TEOS film without the cleaning process has an average thickness of 76.9 Å, while the nitride film with the cleaning process has an average thickness of 82.6 Å. The nitride film deposited after 5 days from the time of deposition of the TEOS film without the cleaning process has an average thickness of 69.3 Å, while the nitride film with the cleaning process has an average thickness of 82.7 Å.

It should be noted that the deposition thickness is drastically decreased form 76.9 Å to 69.3 Å when the cleaning process is not performed. However, the deposition thicknesses are almost the same when the cleaning process is performed.

Improvement of refresh time and writing time (tWR) due to the decrease of the dose of the ion-implant by the cleaning process are shown in Table 2.

TABLE 1

| Cell Vt imp. | 1.70E13 | | 1.60E13 |
|---|---|---|---|
| Cleaning Skip | • | | |
| RN | | • | • |
| $Vt_{sat}(V)$ | 0.741 | 0.787 | 0.740 |
| $Id_{sat}(\mu A)$ | 37.7 | 36.3 | 39 |
| $BV_{dss}(V)$ | 5.0 | 5.0 | 5.1 |
| GIDLBV(V) | 4.4 | 4.4 | 4.6 |
| Refresh(ms) | 130 | 130 | 150 |
| tWR(ns) | 7 | 7 | 4.1 |

Referring to Table 2, variations with and without the cleaning process when ion-implanted with the same dose, and variations with the cleaning process when ion-implanted with different doses are shown.

It should be noted that $Id_{sat}$ is increased by 2.3 μA, $BV_{dss}$ by 0.1V and GIDLBV by 0.2V. It should also be noted that refresh time is improved by 20 ms and write time by 3 ns.

As discussed earlier, in accordance with the present invention, a cleaning process of a buffer layer is performed prior to a formation of a nitride film so that a decrease in a deposition thickness of the nitride film is prevented even when the time between the formation of the buffer layer and the formation of the nitride film is long to improve a reliability of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a semiconductor device, comprising:
    forming an active region defined by a device isolation film on a semiconductor substrate;
    subjecting the active region to an ion-implant process for adjusting threshold voltage;
    forming a gate electrode on the semiconductor substrate;
    forming a TEOS film on the semiconductor substrate by a LPCVD method;
    subjecting the surface of the TEOS film to a cleaning process using a solution selected from the group consisting of $H_2SO_4$ solution, SC-1 solution and a combination thereof; and
    forming $Si_3N_4$ film serving as a gate spacer on the TEOS film by a CVD method.

2. The method according to claim 1, wherein the ion-implant process is performed at a dose ranging from 1.55E13 to 1.65E13 ions/cm$^2$.

3. The method according to claim 1, wherein the ion-implant process comprises a tilt ion-implant process performed at a tilt angle ranging from 0 to 60.

4. The method according to claim 1, volume ratio of $H_2SO_4$ to $H_2O$ ranges from 1:4~50.

* * * * *